United States Patent
Muto et al.

(10) Patent No.: US 7,544,393 B2
(45) Date of Patent: *Jun. 9, 2009

(54) SUBSTRATE TABLE, PRODUCTION METHOD THEREFOR AND PLASMA TREATING DEVICE

(75) Inventors: Shinji Muto, Nirasaki (JP); Chihiro Taguchi, Kofu (JP); Nobuyuki Okayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 493 days.

This patent is subject to a terminal disclaimer.

(21) Appl. No.: 11/330,081

(22) Filed: Jan. 12, 2006

(65) Prior Publication Data

US 2006/0115600 A1    Jun. 1, 2006

Related U.S. Application Data (63) Continuation of application No. 10/478,866, filed as application No. PCT/JP02/05068 on May 24, 2002, now Pat. No. 7,067,178.

(30) Foreign Application Priority Data

May 25, 2001   (JP) .............................. 2001-156489

(51) Int. Cl.
*B05D 1/32* (2006.01)
*C23C 4/10* (2006.01)
*B05C 13/00* (2006.01)
*H01L 21/683* (2006.01)
*B23B 31/28* (2006.01)

(52) U.S. Cl. ....................... 427/448; 427/446; 427/453; 427/250; 427/261; 427/264; 427/270; 427/271; 118/500; 361/234; 279/128

(58) Field of Classification Search ................ 427/448, 427/446, 453, 250, 261, 264, 270, 271; 118/724, 118/725, 728, 500; 156/345.51, 345.52, 156/345.53

See application file for complete search history.

(56) References Cited

U.S. PATENT DOCUMENTS

| | | | |
|---|---|---|---|
| 4,147,821 A | 4/1979 | Young | |
| 4,480,284 A | 10/1984 | Tojo et al. | 361/234 |
| 5,720,818 A * | 2/1998 | Donde et al. | 118/500 |
| 5,792,562 A | 8/1998 | Collins et al. | |
| 6,120,661 A | 9/2000 | Hirano et al. | 204/298.15 |
| 6,358,466 B1 | 3/2002 | Besser et al. | 266/234 |
| 7,067,178 B2 * | 6/2006 | Muto et al. | 427/448 |

(Continued)

FOREIGN PATENT DOCUMENTS

JP           63274704 A       11/1988

(Continued)

*Primary Examiner*—Karla Moore
(74) *Attorney, Agent, or Firm*—Oblon, Spivak, McClelland, Maier & Neustadt, P.C.

(57) ABSTRACT

The susceptor of a plasma treating device, or the electrostatic chuck of a substrate table, is formed by ceramic thermal spray method. A thermally sprayed ceramic layer is pore-sealed by methacrylic resin. Resin raw material mainly containing methyl methacrylate is applied to and impregnated into the thermally sprayed ceramic layer and then is cured to thereby fill pores between ceramic particles in the thermally sprayed ceramic layer with methacrylic resin. Methacrylic resin raw material solution, which does not produce pores at curing, can complete perfect pore sealing.

20 Claims, 7 Drawing Sheets

U.S. PATENT DOCUMENTS

2004/0058070 A1 * 3/2004 Takeuchi et al. ............ 427/282

FOREIGN PATENT DOCUMENTS

| JP | 6-196548 | 7/1994 |
| JP | 6-232243 | 8/1994 |
| JP | 09213777 A | 8/1997 |
| JP | 11-10472 | 1/1999 |
| JP | 2000-183145 | 6/2000 |
| JP | 2001-7189 | 1/2001 |
| KR | 1996-0030364 | 8/1996 |
| KR | 2000-0006012 | 1/2000 |

* cited by examiner

SUBSTRATE TABLE, PRODUCTION METHOD THEREFOR AND PLASMA TREATING DEVICE

This application is a continuation of application Ser. No. 10/478,866, filed on Nov. 25, 2003, which is a national stage application of International Application PCT/JP02/05068, filed on May 24, 2002, which claims priority to JP 2001-156489, filed on May 25, 2001, the entire contents of each of which are incorporated herein by reference.

FIELD OF THE INVENTION

The present invention relates to an improvement of a substrate table for mounting thereon a substrate such as a semiconductor wafer in a chamber of a plasma processing apparatus; and, more particularly, to a technique for forming an electrostatic chuck on a substrate table by employing a ceramic thermal spray method and for sealing pores of the electrostatic chuck.

BACKGROUND OF THE INVENTION

Figure 8A:
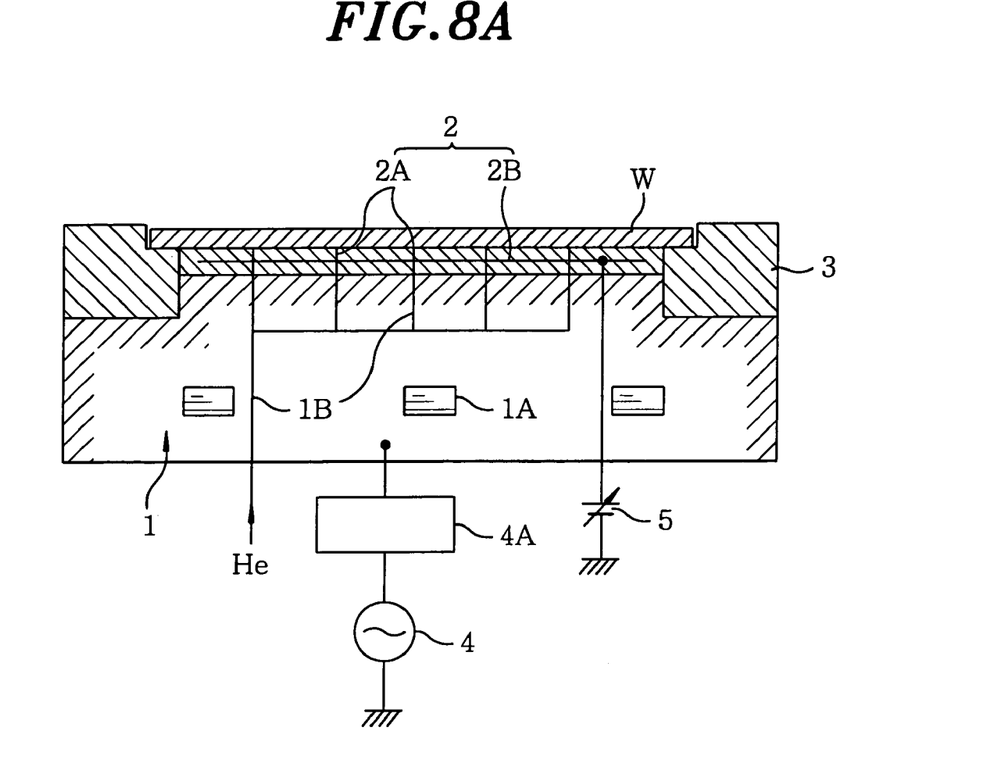
FIG. 8A is a cross sectional view thereof and FIG. 8B is a conceptual view of a thermally sprayed alumina layer of an electrostatic chuck in FIG. 8A.

A plasma processing apparatus performs a processing such as a film formation on a substrate, e.g., a semiconductor wafer, which is mounted on a substrate table called a susceptor disposed in a process chamber, by using a plasma generated from a process gas introduced into the process chamber. A susceptor employed in the plasma processing apparatus includes a main body 1, an electrostatic chuck 2 disposed on the main body 1 and a focus ring 3 disposed along an outer periphery of the main body 1 in such a manner that it surrounds the electrostatic chucks 2, as shown in FIG. 8A for example. A wafer W is adsorptively fixed on the susceptor by the electrostatic chuck 2. The process chamber is maintained at a predetermined vacuum level and a predetermined high frequency power is applied from a high frequency power supply 4 connected to the main body 1 via a matching unit 4A. The plasma of the process gas generated between an upper electrode (not shown) and the susceptor is converged onto the wafer W by the focus ring 3. Further, formed within the main body 1 is a coolant passageway 1A through which a coolant circulates to cool the main body 1, which in turn cools the wafer W whose temperature rises during the plasma processing, so that the wafer W is maintained at a constant process temperature. Further prepared within the main body 1 is a gas channel 1B of a thermally conductive gas (e.g., He gas), which has openings at plural spots on a top surface of the main body 1. Formed in the electrostatic chuck 2 are through holes 2A corresponding to the gas channel 1B. The He gas is supplied between the electrostatic chuck 2 and the wafer W via the gas channel 1B and the through holes 2A to serve as a heat transfer medium in a narrow elongated gap existing between the electrostatic chuck 2 and the wafer W. As a result, a heat flow from the wafer W to the electrostatic chuck 2 and, further, to the main body 1 is facilitated, thereby efficiently cooling the wafer W. The electrostatic chuck 2 is of a plate shape obtained by sintering a ceramic such as alumina. Embedded in the electrostatic chuck 2 is an electrode plate 2B connected to a DC power supply 5. The electrostatic chuck 2 adsorbs the wafer W by an electrostatic force generated by a high voltage applied thereto from the DC power supply 5.

Since it is hard to produce a large sized thin plate by ceramic sintering, a manufacture of the electrostatic chuck 2 of a reasonable size for a large wafer W is also difficult. Therefore, recently, electrostatic chucks are fabricated by employing a ceramic thermal spray technique (see, for example, Japanese Patent No. 2971369). An electrostatic chuck obtained by ceramic thermal spray is hygroscopic due to pores existing between ceramic particles. Therefore, a pore sealing process is executed on the electrostatic chuck by using a silicone resin. The pore sealing process involves the steps of impregnating a silicone resin raw material solution, which is obtained by dissolving methyl sillyl triisocynate in ethyl acetate, into a thermally sprayed alumina layer of the electrostatic chuck; and then heating the electrostatic chuck in the atmosphere at a temperature of about 70° C. for about 8 hours, so that the methyl sillyl triisocynate is polymerized and cured to become the silicone resin. By repeating the impregnation step and the curing step plural times, the pore sealing process is completed.

Figure 7:
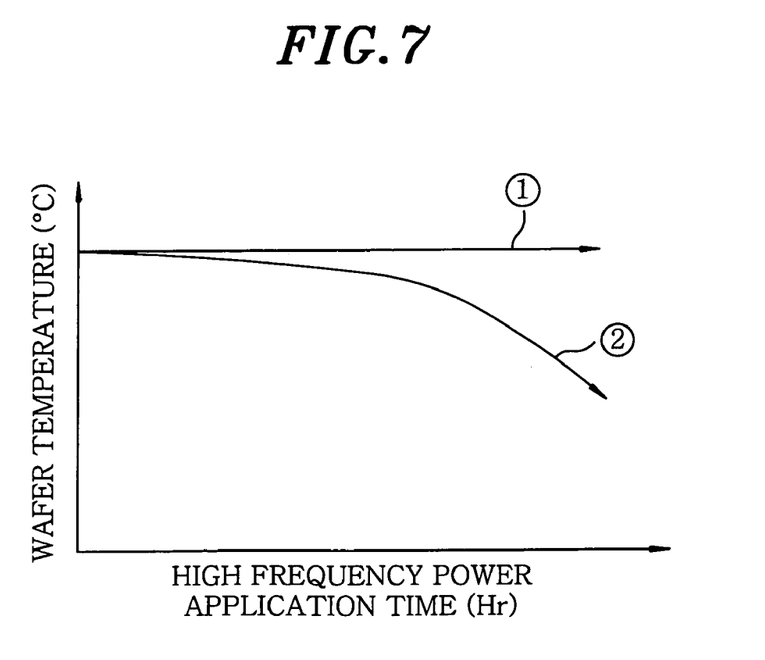
FIG. 7 describes relationships between an application time of a high frequency power and a wafer temperature for the cases where plasma process is performed by using the substrate table shown in FIG. 1 and a conventional substrate table, respectively.

However, in case of performing a plasma processing on the wafer W by applying a high frequency power at a high vacuum region (e.g., 100 mTorr) through the use of the ceramic sprayed electrostatic chuck on which the pore sealing process using the silicon resin is executed, there occurs a phenomenon that a surface temperature of the wafer is gradually reduced during plasma processing as the application time of the high frequency power increases, as illustrated by a graph ②  in FIG. 7.

SUMMARY OF THE INVENTION

It is, therefore, an object of the present invention to provide a substrate table capable of processing a substrate at a stable temperature and a method for the manufacture thereof.

Figure 8B:
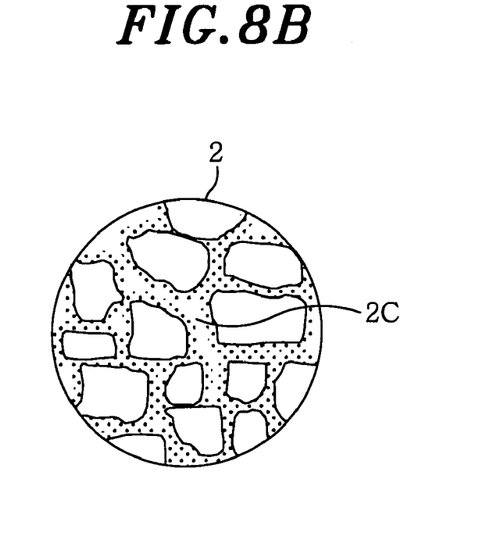
Figure 9A:
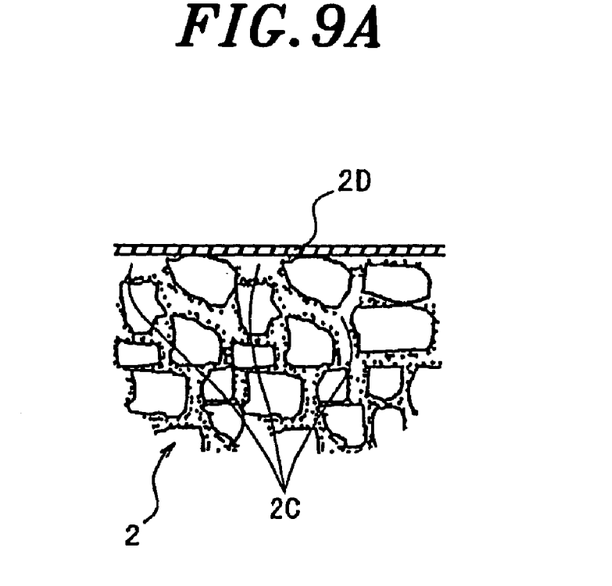
FIG. 9A is a cross sectional view thereof and FIG. 9B is a cross sectional view showing a case where a portion of the thermally sprayed alumina layer of the electrostatic chuck in FIG. 9A is being peeled off.

The inventors of the present invention investigated causes leading to a decrease in temperature of a wafer during a substrate processing and reached a conclusion as follows. If a silicone resin raw material solution is polymerized and cured after being impregnated into a thermally sprayed alumina layer, surfaces of alumina grains are coated with a silicone resin, leading to a formation of a silicon resin layer. At this time, ethyl acetate, which is an organic solvent for dilution, evaporates in the thermally sprayed alumina layer. As a result, there are left traces of evaporation in the form of pores 2C between the alumina grains as conceptually illustrated in FIG. 8B. Further, as shown in FIG. 9A, there is formed a film 2D of silicone resin on an adsorption surface of the electrostatic chuck 2.

Figure 9B:
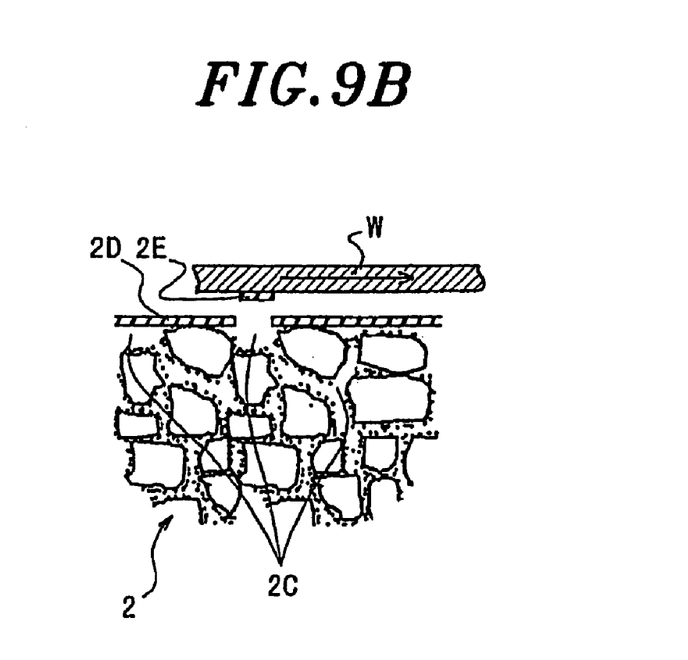

At a time of removing the wafer W from a susceptor after processing the wafer, a part 2E of the silicone resin film 2D on the adsorption surface of the electrostatic chuck may be peeled off therefrom because the part 2E is stuck to the wafer W, as shown in FIG. 9B. In such a case, pores 2C between the alumina grains are disposed open through the adsorption surface of the electrostatic chuck 2. The inventors of the present invention concluded that a surface temperature of an object to be processed is decreased with an aging characteristic due to these pores 2C being disposed open on the surface of the electrostatic chuck 2. In FIGS. 9A and 9B, the silicone resin is schematically shown as block dots to express a state where ceramic particles are coated with the silicone resin.

The present invention is conceived from the above conclusion. In accordance with the present invention, there is provided a substrate table including: a table main body; and an electrostatic chuck layer formed on the table main body and made of a thermally sprayed ceramic layer incorporating therein an electrode layer, wherein the thermally sprayed ceramic layer is pore-sealed by methacrylic resin.

Since the methacrylic resin does not produce pores while being cured, an adverse effect of pores in the electrostatic chuck on a substrate temperature control can be avoided.

Preferably, the methacrylic resin is obtained by curing a resin raw material solution containing methyl methacrylate as a main component thereof. The resin raw material further containing a stabilizer, an additive, and the like in addition to the main component of methyl methacrylate is used.

The thermally sprayed ceramic layer is made of at least one of aluminum oxide, aluminum nitride, silicon nitride, and titanium oxide.

The substrate table in accordance with the present invention can be appropriately applied to various plasma processing apparatus.

In accordance with the present invention, there is further provided a method for manufacturing a substrate table, including the steps of: preparing a table main body; forming on the table main body an electrostatic chuck layer made of a ceramic layer incorporating therein an electrode layer, wherein the step of forming the electrostatic chuck has the steps of forming the ceramic layer by thermally spraying a ceramic material; and sealing pores in the ceramic layer by using methacrylic resin.

Preferably, the pore sealing step has the steps of: impregnating a resin raw material solution containing methyl methacrylate as a main component thereof into the ceramic layer; and curing the resin raw material.

Further, at the step of forming the ceramic layer by thermal spraying, the spraying is preferably conducted while the table main body is heated.

If a gas channel for supplying a gas to a substrate is formed in the table main body, it is preferable that, at the step of forming the ceramic layer by thermal spraying, the spraying is performed while ejecting a pressured gas from the gas channel. By this, a gas channel communicating with the gas channel in the table main body can be formed in the thermally sprayed ceramic layer without recourse to an additional machine work.

BRIEF DESCRIPTION OF THE DRAWINGS

FIG. 1 shows a substrate table in accordance with an embodiment of the present invention, wherein

FIG. 8 is a counterpart view of FIG. 1, illustrating the conventional substrate table, wherein

FIG. 9 is a conceptual cross sectional view of a part of the thermally sprayed alumina layer of the electrostatic chuck shown in FIG. 8, wherein

DETAILED DESCRIPTION OF THE PREFERRED EMBODIMENTS

Figure 1A:
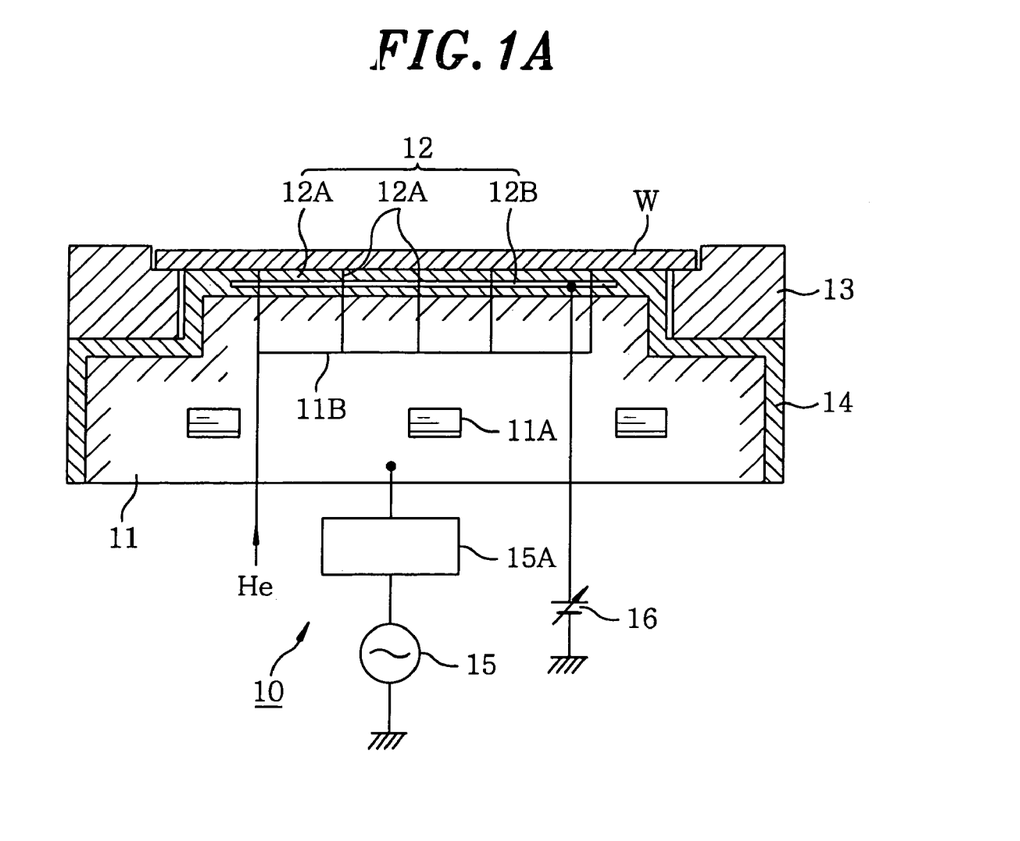
FIG. 1A is a cross sectional view thereof and FIG. 1B is a conceptual view of an electrostatic chuck layer shown in FIG. 1A.

As shown in FIG. 1A, a susceptor 10, i.e., a substrate table, includes an aluminum main body 11 having an outer peripheral portion formed lower than a central portion thereof at a top surface thereof; an electrostatic chuck layer 12 formed on the top surface of the main body 11 by thermal spraying; and a focus ring 13 formed to surround the electrostatic chuck layer 12. A peripheral surface of the main body 11 is coated with a thermally sprayed alumina layer 14 formed by alumina thermal spraying. A thermally sprayed alumina layer constituting the electrostatic chuck 12 is formed as a single body with the thermally sprayed alumina layer 14.

The electrostatic chuck layer 12 has a thermally sprayed alumina layer 12A and an electrode layer 12B made of tungsten and installed within the thermally sprayed alumina layer 12A. A total thickness of the electrostatic chuck layer 12 is about 600 µm. The electrode layer 12B is formed by thermally spraying tungsten and its thickness is about 50 µm.

Further, a ceramic material constituting the thermally sprayed layers 12A and 14 is not limited to alumina. Any one of alumina (aluminum oxide), aluminum nitride, silicon nitride and titanium oxide or a mixture of at least two of them can be employed. The thermally sprayed alumina layer 12A is pore-sealed by a methacrylic resin as will be described later in detail.

Formed within the main body 11 are a coolant passageway 11A and a gas channel 11B. Provided in the electrostatic chuck layer 12 are through holes 12C corresponding to the gas channel 11B. A thermally conductive gas such as He gas is supplied between a wafer W and the electrostatic chuck layer 12 from the through holes 12C, thereby increasing a thermal conductivity therebetween. Accordingly, the wafer W can be efficiently cooled by the main body 11. As in the prior art, a high frequency power supply 15 is connected to the main body 11 via a matching unit 15A, while a DC power supply 16 is connected to the electrode layer 12B of the electrostatic chuck layer 12.

Figure 2:
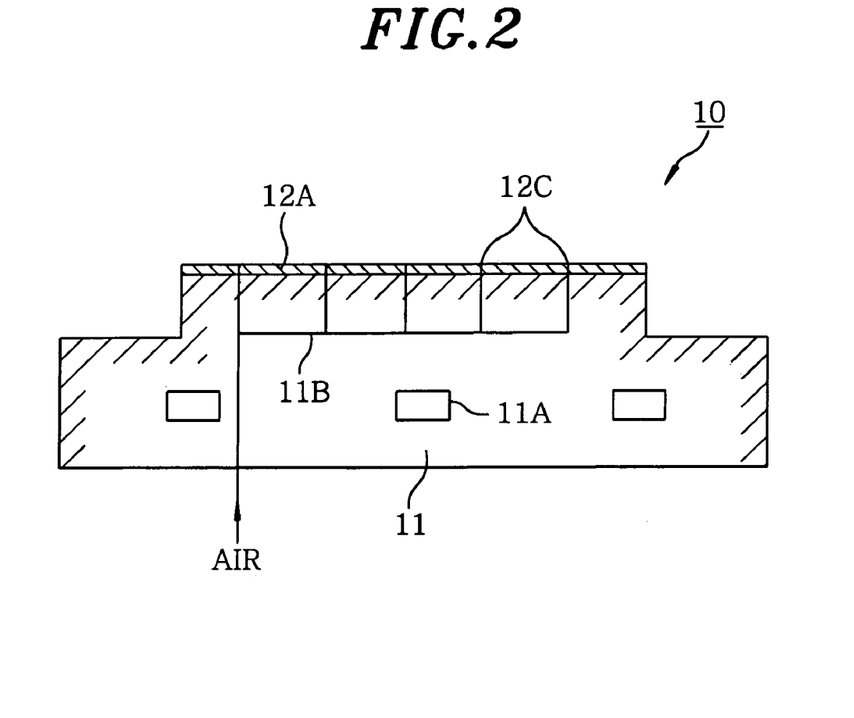
FIG. 2 describes a manufacturing process of the substrate table shown in FIG. 1, wherein there is illustrated a cross sectional view of a state in which a thermally sprayed alumina layer constituting an electrostatic chuck layer is formed on a top surface of a main body.

A method for manufacturing the susceptor 10 will now be described with reference to FIGS. 2 to 6. First, a main body 11 having the coolant passageway 11A and the gas channel 11B formed therein is prepared. A lower peripheral portion of top surface of the main body 11 is masked. Then, the main body 11 is heated up to about 150° C., and a pressurized air having a gauge pressure of about 98 KPa is provided into the gas channel 11B of the main body 11 to be ejected through openings thereof. In this state, alumina is sprayed onto the main body 11 to thereby form the thermally sprayed alumina layer 12A of 450 μm as shown in FIG. 2. By ejecting the pressurized air, through holes 12C corresponding to the gas channel 11B can be formed in the thermally sprayed alumina layer 12A concurrently with the alumina thermal spraying. Then, the thermally sprayed alumina layer 12A is polished until its thickness becomes about 300 μm.

Figure 3:
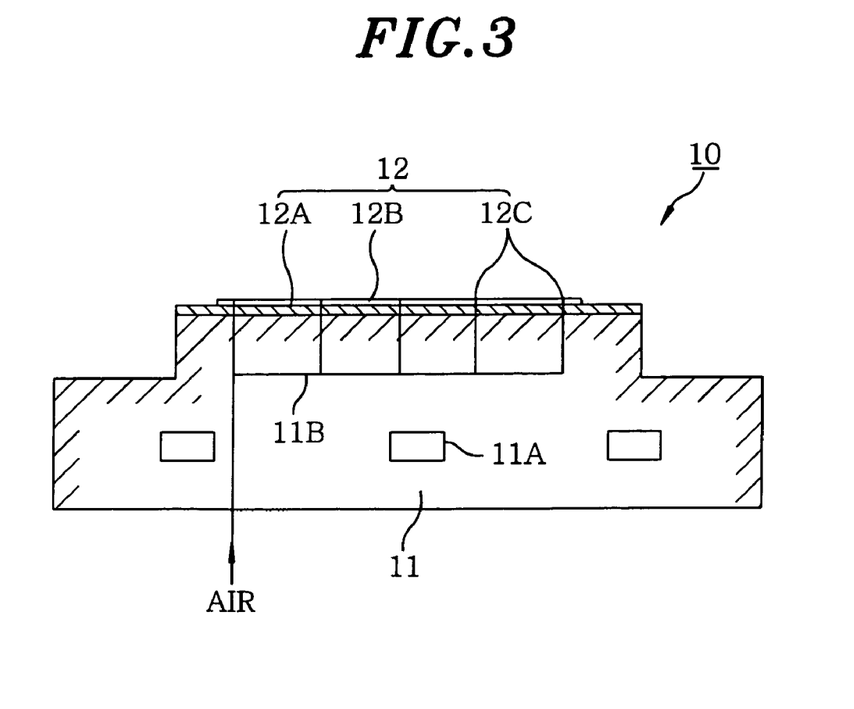
FIG. 3 explains the manufacturing process of the substrate table shown in FIG. 1, wherein a cross sectional view of a state in which an electrode layer constituting the electrostatic chuck layer is formed is illustrated.

Subsequently, an electrode layer 12B is formed. Specifically, a top surface of the thermally sprayed alumina layer 12A excluding a region thereof on which the electrode layer 12B is to be formed is masked. Then, tungsten is thermally sprayed on the thermally sprayed alumina layer 12A while supplying a pressurized air into the gas channel 11B at room temperature, thereby forming the electrode layer 12B of 50 μm as shown in FIG. 3. The through holes 12C are also formed in the electrode layer 12B concurrently with the tungsten thermal spraying. Afterward, neighboring portion around the through holes 12C are blast-processed by using an abrasive of grade 60 (Japanese Industrial Standard: JIS) to prevent the through holes 12C from being clogged. Thereafter, a mask for forming the electrode layer 12B is removed.

Figure 4:
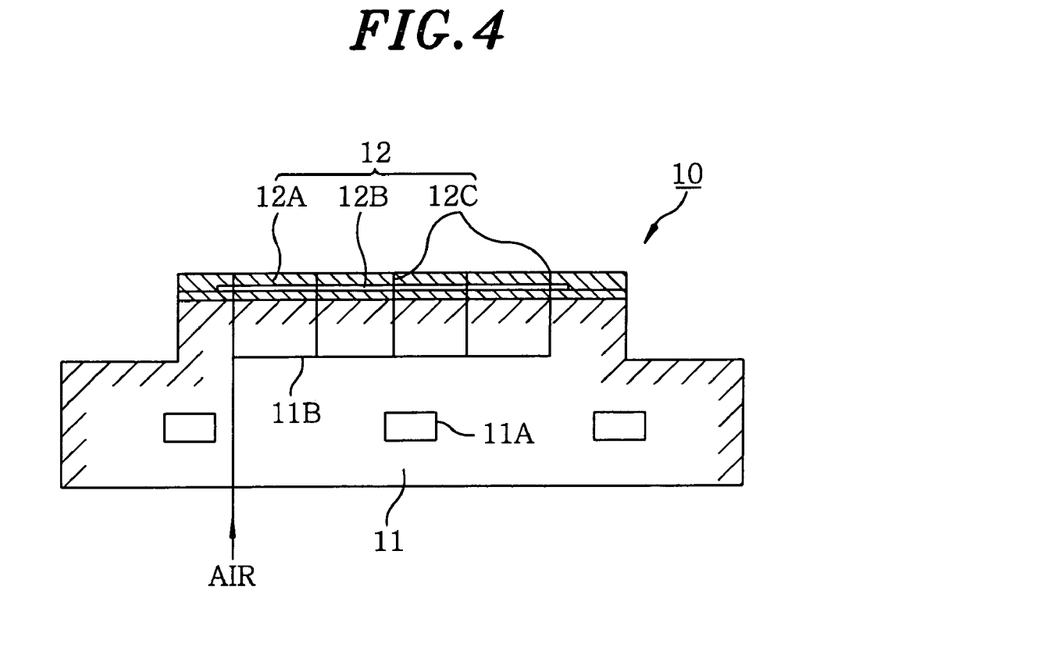
FIG. 4 illustrates the manufacturing process of the substrate table shown in FIG. 1, wherein a cross sectional view of a state in which the electrostatic chuck layer is formed is illustrated.

Next, the main body 11 is heated up to 150° C. In this state, alumina is thermally sprayed onto the electrode layer 12B while ejecting a pressurized air through the openings of the gas channel 11B, thereby forming another thermally sprayed alumina layer 12A of 400 μm on the electrode layer 12B as shown in FIG. 4. The through holes 12C are also formed in the thermally sprayed alumina layer 12B concurrently with the alumina thermal spraying.

By the thermal spraying processes described above, the electrostatic chuck layer 12 having the electrode layer 12B embedded in the thermally sprayed alumina layer 12A is formed as a single body with the main body 11, as illustrated in FIG. 4.

Thereafter, a pore sealing process of the thermally sprayed alumina layer 12A is executed. First, a methacrylic resin raw material solution containing a liquid of methyl methacrylate as a main component thereof is coated on the electrostatic chuck layer 12 by using a roller. As a result, the methacrylic resin raw material solution permeates into pores in the thermally sprayed alumina layer 12A of the electrostatic chuck layer 12.

Subsequently, the main body 11 on which the electrostatic chuck layer 12 is formed is loaded into a vacuum vessel and a deaeration process is performed at a vacuum level of 0.1 Torr. During the vacuum deaeration process, methacrylic resin is formed in the thermally sprayed alumina layer 12A via a copolymerization by a polymerization catalyzer contained in the methacrylic resin raw material solution. Consequently, the pores in the thermally sprayed alumina layer 12A are filled with the methacrylic resin as shown in FIG. 1B.

Figure 1B:
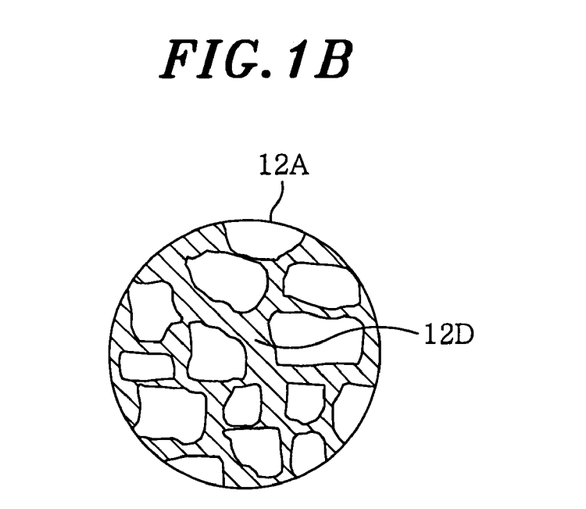

Since no volatile compound is contained in the methacrylic resin raw material solution, it is possible to completely fill the pores between alumina grains with the methacrylic resin (hatched portion), as conceptually illustrated in FIG. 1B. Accordingly, there occurs no pore formation due to an evaporation of an organic solvent, unlike in a pore sealing process using silicone resin.

Further, the curing of the methacrylic resin raw material solution can also be achieved by heating and sintering the main body 11 at a temperature ranging from 60 to 70° C. for 5 to 8 hours.

Though the pore sealing process is performed only on the thermally sprayed alumina layer 12A disposed on the electrode layer 12B in the above embodiment, the pore sealing process may also be executed on the thermally sprayed alumina layer 12A located below the electrode layer 12B before the formation of the electrode layer 12B. In such a case, a formation of pores in the electrostatic chuck layer 12 can be prevented more effectively.

Figure 5:
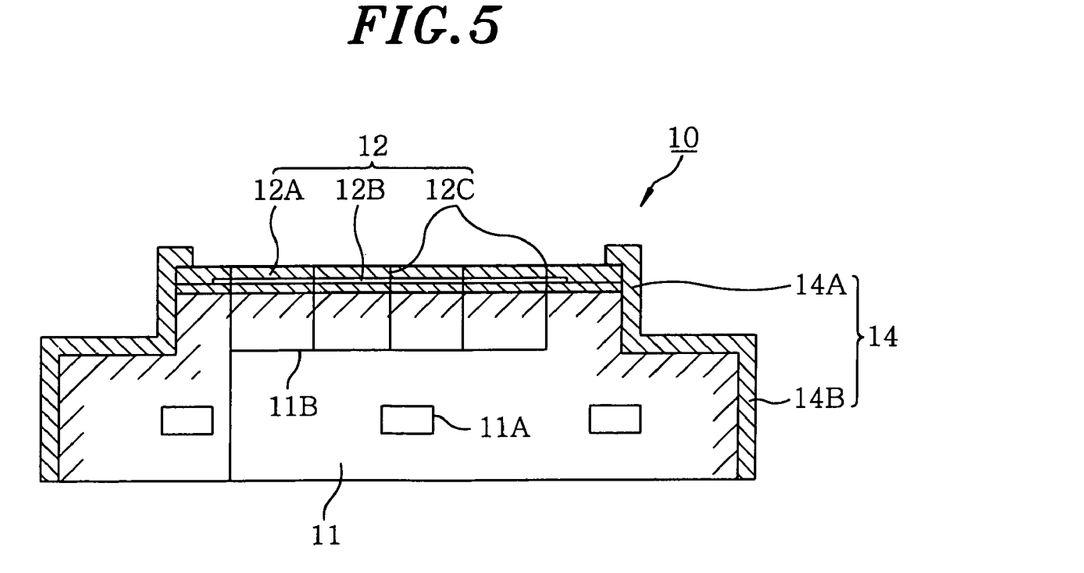
FIG. 5 describes the manufacturing process of the substrate table shown in FIG. 1, wherein a cross sectional view of a state in which a thermally sprayed alumina layer is formed on an outer peripheral surface of the main body is illustrated.

After performing the pore sealing process by using the methalcrylic resin, the electrostatic chuck layer 12 excluding an outer peripheral portion thereof is masked and, at the same time, the mask material of the outer peripheral portion of the top surface of the main body 11 is removed. Then, alumina is thermally sprayed on the outer peripheral surface of the main body 11 at room temperature, thereby forming a thermally sprayed alumina layer 14 of 750 μm as shown in FIG. 5. Thus, the thermally sprayed alumina layers 12A and 14 are integrated as one body, as shown in FIG. 5.

Next, a thermally sprayed alumina layer 14A around an outer peripheral surface of the electrostatic chuck layer 12 is coated and impregnated with the methacrylic resin raw material solution, while another thermally sprayed alumina layer 14B is coated and impregnated with a silicone resin raw material solution. Then, the resin raw material solutions are cured. Further, the thermally sprayed alumina layer 14B may also be coated and impregnated with the methacrylic resin raw material solution.

Figure 6:
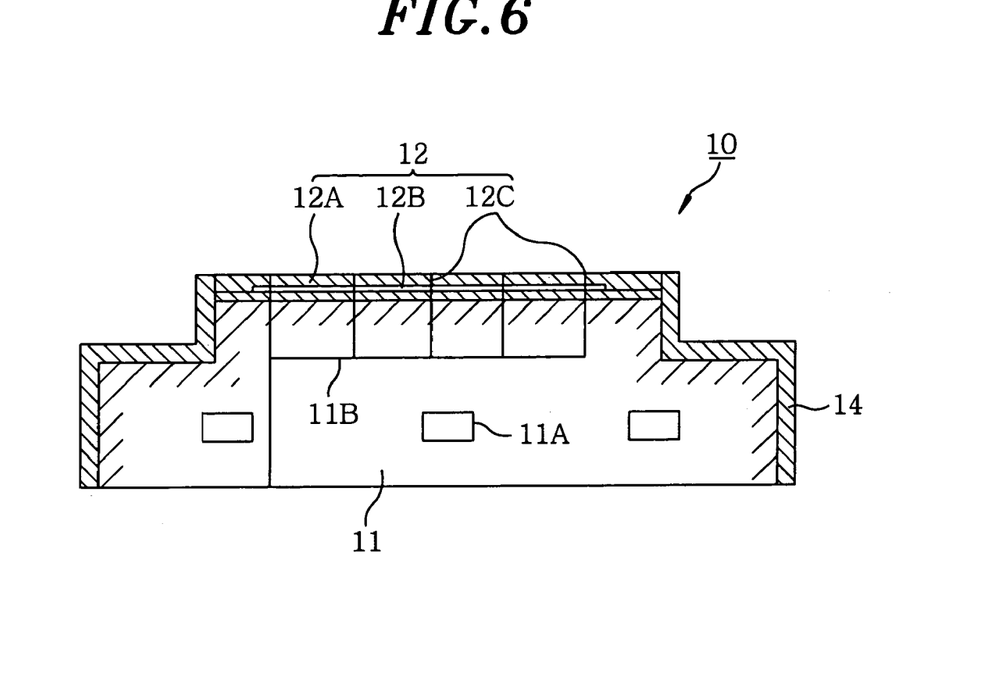
FIG. 6 demonstrates a manufacturing process of the substrate table shown in FIG. 1, wherein a cross sectional view of a state after polishing the thermally sprayed alumina layer is illustrated.

Thereafter, the masking is removed from the surface of the electrostatic chuck layer 12, and the electrostatic chuck layer 12 and the thermally sprayed alumina layer 14 are ground through the use of a grinder, thereby flattening surfaces of the electrostatic chuck layer 12 and the thermally sprayed alumina layer 14 and a neighboring circumferential surface of the main body 11 as shown in FIG. 6. At this time, the surface of the electrostatic chuck layer 12, i.e., a surface that makes a contact with the wafer is set to have a flatness of Ra=0.2 to 0.3. It is preferable to set a thickness of the thermally sprayed alumina layer deposited on the electrode layer 12B to be equal to or smaller than 250 μm.

Thereafter, a red check was conducted on the susceptor 10 fabricated by the sequence of processes described above to investigate a filling state of the thermally sprayed alumina layer 12A by the methacrylic resin 12D.

The red check which is equivalent to Dye Penetrant Testing is carried out by coating a red dye and spraying a white developing solution after wiping the red dye on a surface. If there exists a defect on the surface of a test object (i.e., if there exists a pore which is not sealed in this case), the red dye left in such a defect floats on a dried white developing solution layer, so that the defect can be identified with the eye. Moreover, it is also possible to check whether pores are being sealed or not by shades of color of the coated red dye, instead of using the white developing solution.

The test was executed after conducting the pore sealing process three times by using the methacrylic resin raw material solution. The result of the red check performed on the electrostatic chuck layer 12 showed no unsealed pores. Further, the red check was performed on a surface of the electrostatic chuck layer 12 whose surface was cut down to a depth of 75 μm. However, there was found no unsealed pore. Furthermore, the surface of the electrostatic chuck layer was cut down to 100 μm, 150 μm, 200 μm and 250 μm step by step and the red check was conducted at each step, but there was found no unsealed pore at each step. Such a red check revealed that the sealing of pores in the electrostatic chuck layer 12 was perfectly conducted at least down to a depth 250 μm by the methacrylic resin 12D.

Further, as comparative examples, there were prepared electrostatic chuck layers on which the pore sealing process was executed 5, 10, 15 and 20 times by using the silicone resin and the red check was conducted for each of the electrostatic chuck layers. The result showed the coloration in all the electrostatic chuck layers, though the color becomes lighter as the number of sealing processes increases.

Further, each electrostatic chuck layer was cut after completing the pore sealing process in order to investigate a permeation state of the red dye. The result also showed that coloration of a cross section of each electrostatic chuck layer becomes lighter as the sealing process is repeated.

Accordingly, it was proven that pores remain in the electrostatic chuck layers in case a pore sealing process is conducted by using the silicone resin.

Subsequently, a plasma processing was conducted on a wafer W by using the susceptor 10 manufactured as described above and, then, a relation between a high frequency power application time and a surface temperature of the wafer W was obtained. As a result, it was found that the surface temperature of the wafer W was maintained constant without being reduced even though the high frequency power applying time increases, as shown in FIG. 7. That is, if the electrostatic chuck layer 12 is sealed by the methacrylic resin, there remains no pore between alumina grains, unlike in the conventional cases. Accordingly, a temperature decrease in the wafer due to the lapse of time can be prevented in conducting the plasma processing at a high vacuum range.

Particularly, even in a case where a feed pressure of a thermally conductive gas is changed from 10 to 40 Torr to a low pressure of 5 to 10 Torr in a control process for changing the temperature of the wafer W from 100° C. to 120° C., the thermally conductive gas of the low pressure can reach the backside of the wafer W without permeating between alumina grains in the thermally sprayed alumina layer 12A. Therefore, the temperature of the wafer W can be controlled much more accurately.

In accordance with the embodiment of the present invention, a decrease in the surface temperature of the wafer W can be prevented and a plasma processing can be stably performed at a predetermined temperature even though the processing of wafer W processing is conducted at a high vacuum range for a long time.

Further, there was a limit in a service temperature of a conventional susceptor since there was a risk in that a thermally sprayed ceramic layer constituting an electrostatic chuck layer could be cracked due to a difference between a thermal expansion coefficient of the aluminum material and that of the thermally sprayed ceramic layer. In the embodiment, however, a ceramic is thermally sprayed on the aluminum material which is thermally expanded by heating the main body 11. Therefore, a thermal stress between the aluminum material and the thermally sprayed ceramic layer 12A can be reduced when the temperature of the susceptor increases, and thus a heat resisting temperature of the susceptor 10 can be raised.

Figure 10:
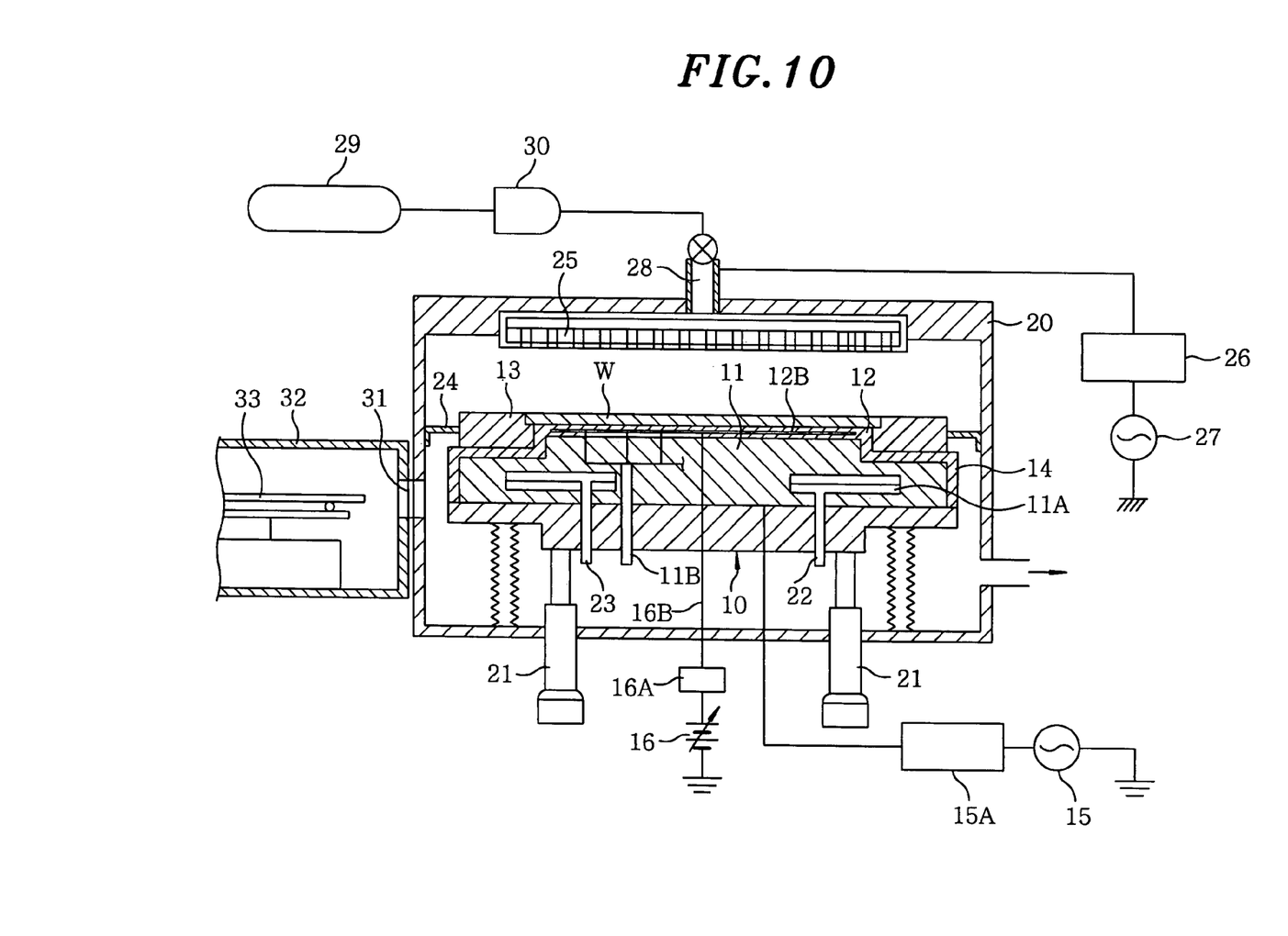
FIG. 10 is a schematic cross sectional view of an exemplary plasma processing apparatus incorporating therein the substrate table shown in FIG. 1.

The susceptor 10, i.e., the substrate table, provided by the present invention can be widely applied to various plasma processing apparatuses such as a capacitive coupling type plasma processing apparatus, an induction coupling type plasma processing apparatus, a microwave plasma processing apparatus, and the like. FIG. 10 depicts an overall structure of a microwave plasma processing apparatus to which the susceptor described above is applicable.

Installed within a processing vessel 20 made of a conductive material such as aluminum is a susceptor 10 which can be moved up and down by an elevator unit 21 such as an air cylinder. The susceptor 10 has the same configuration as the one described in FIG. 1. An electrostatic chuck layer 12 is formed by the method described earlier with reference to FIGS. 2 to 6. A properly temperature-adjusted coolant is introduced into a coolant passageway 11A prepared in a main body 11 through an inlet tube 22 and then is discharged through an outlet tube 23 after being used for a heat exchange. A high DC voltage is applied to a tungsten electrode layer 12B within the electrostatic chuck layer 12 from a DC power supply 16 via a filter 16A and a lead line 16B, whereby the electrostatic chuck layer adsorbs the wafer W.

Disposed around the wafer W adsorptively held on the electrostatic chuck layer 12 is an annular focus ring 13, which is formed of an insulating or a conductive material depending on a process performed by a plasma processing apparatus. The focus ring 13 serves to confine or expand reactive ions (plasma). Further, installed between the susceptor 10 and the processing vessel 20 is an exhaust ring 24 provided with exhaust openings not shown in the drawing. By the exhaust ring 24, an exhaust flow from a processing space can be controlled and, further, plasma can be appropriately confined between the susceptor 10 serving as a lower electrode and an upper electrode 25 disposed above the susceptor 10.

The susceptor is moved up and down depending on a process to be performed, and the distance between the upper electrode 25 and the susceptor 10 is adjusted. A high frequency power of 2 to 13.56 MHz is applied to the main body 11 of the susceptor 10 from a high frequency power supply 15 via an impedance matching unit 15A. A high frequency power of 13.56 to 100 MHz is applied to the upper electrode 25 from a high frequency power supply 27 via an impedance matching unit 26.

A process gas is supplied to the upper electrode 25 from a process gas supply unit 29 via a process gas supply tube 28 and a mass flow controller 30. The process gas is converted into plasma by the high frequency powers, so that a predetermined processing can be carried out on the wafer W by the plasma. A loadlock chamber 32 is connected to a side wall of the processing vessel 20 via a gate valve 31. A transfer arm 33 mounted in the loadlock chamber 32 transfers the wafer W between the loadlock chamber 32 and the processing vessel.

What is claimed is:

1. A method for manufacturing a substrate table, comprising the steps of:
    preparing a table main body;
    forming on the table main body an electrostatic chuck layer including an upper ceramic layer on which an object to be processed is mounted, a lower ceramic layer and an electrode layer disposed between the upper ceramic layer and the lower ceramic layer, the step of forming the electrostatic chuck layer including the step of forming the upper ceramic layer by thermally spraying a ceramic material while the table main body is heated,
    wherein a gas channel for supplying a gas to a substrate is formed in the table main body and, at the step of forming the ceramic layer by thermal spraying, the thermal spraying is performed while ejecting a pressurized air from the gas channel, allowing a gas channel communicating with the gas channel in the table main body to be formed in the thermally sprayed ceramic layer.

2. The method of claim 1, wherein the upper ceramic layer has a surface flatness of Ra=0.2 to 0.3.

3. The method of claim 1, wherein the upper ceramic layer has a thickness equal to or smaller than 250 μm.

4. The method of claim 1, wherein the lower ceramic layer is pore-sealed by using a methacrylic resin.

5. The method of claim 1, wherein a peripheral surface of the table main body is covered with a ceramic layer formed by thermal spraying and integrated as one body with the upper ceramic layer.

6. The method of claim 5, wherein the upper ceramic layer covering the peripheral surface of the table main body is pore-sealed by using a methacrylic resin.

7. The method of claim 1, further comprising the step of sealing pores existing in the upper ceramic layer by using a methacrylic resin, the step of sealing pores including the step of impregnating a resin raw material solution containing methyl methacrylate as a main component thereof into the ceramic layer and the step of curing the resin raw material solution.

8. The method of claim 7, wherein the step of curing the resin raw material solution is performed by a deaeration process.

9. The method of claim 8, wherein the deaeration process is performed at 0.1 torr or less.

10. The method of claim 1, wherein the table main body is heated to about 150° C.

11. A method for manufacturing a substrate table, comprising the steps of:
  preparing a table main body; and
  forming on the table main body an electrostatic chuck layer including an upper ceramic layer on which an object to be processed is mounted, a lower ceramic layer and an electrode layer disposed between the upper ceramic layer and the lower ceramic layer,
  wherein the upper ceramic is formed by a method including the steps of:
    heating the table main body up to a predetermined temperature; and then
    forming the upper ceramic layer by thermally spraying an ceramic material while heating the table main body,
  wherein a gas channel for supplying a gas to a substrate is formed in the table main body and, at the step of forming the upper ceramic layer by thermal spraying, the thermal spraying is performed while ejecting a pressurized air from the gas channel, allowing a gas channel communicating with the gas channel in the table main body to be formed in the thermally sprayed upper ceramic layer.

12. The method of claim 11, wherein the upper ceramic layer has a surface flatness of Ra=0.2 to 0.3.

13. The method of claim 11, wherein the upper ceramic layer has a thickness equal to or smaller than 250 μm.

14. The method of claim 11, wherein the lower ceramic layer is pore-sealed by using a methacrylic resin.

15. The method of claim 11, wherein a peripheral surface of the table main body is covered with a ceramic layer formed by thermal spraying and integrated as one body with the upper ceramic layer.

16. The method of claim 15, wherein the ceramic layer covering the peripheral surface of the table main body is pore-sealed by using a methacrylic resin.

17. The method of claim 11, further comprising the step of sealing pores existing in the upper ceramic layer by using a methacrylic resin, the step of sealing pores including the step of impregnating a resin raw material solution containing methyl methacrylate as a main component thereof into the upper ceramic layer and the step of curing the resin raw material solution.

18. The method of claim 17, wherein the step of curing the resin raw material solution is performed by a deaeration process.

19. The method of claim 18, wherein the deaeration process is performed at 0.1 torr or less.

20. The method of claim 11, wherein the predetermined temperature is about 150° C.

* * * * *